US011204634B2

(12) United States Patent
Brooks et al.

(10) Patent No.: US 11,204,634 B2
(45) Date of Patent: Dec. 21, 2021

(54) POWER MONITORING AND REDUCTION

(71) Applicant: Hewlett-Packard Development Company, L.P., Houston, TX (US)

(72) Inventors: Robert C Brooks, Houston, TX (US); Michael R Durham, Houston, TX (US); Mark A. Piwonka, Houston, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 112 days.

(21) Appl. No.: 16/097,824

(22) PCT Filed: Jul. 19, 2016

(86) PCT No.: PCT/US2016/042919
§ 371 (c)(1),
(2) Date: Oct. 30, 2018

(87) PCT Pub. No.: WO2018/017056
PCT Pub. Date: Jan. 25, 2018

(65) Prior Publication Data
US 2019/0138074 A1 May 9, 2019

(51) Int. Cl.
*G06F 1/30* (2006.01)
*G05F 1/66* (2006.01)
(Continued)

(52) U.S. Cl.
CPC ............. *G06F 1/305* (2013.01); *G05F 1/66* (2013.01); *G06F 1/28* (2013.01); *G01R 19/16528* (2013.01)

(58) Field of Classification Search
CPC ... G06F 1/305; G06F 1/28; G05F 1/66; G01R 19/16528
See application file for complete search history.

(56) References Cited

U.S. PATENT DOCUMENTS

| 5,764,999 A | 6/1998 | Wilcox et al. |
| 6,446,213 B1 | 9/2002 | Yamaki |
| 7,378,977 B2 | 5/2008 | Huang |
| (Continued) | | |

FOREIGN PATENT DOCUMENTS

| CN | 101067759 | 11/2007 |
| CN | 102318182 | 1/2012 |
| (Continued) | | |

OTHER PUBLICATIONS

Brian Delgado et al., Sep. 22-24, 2013,Performance Implications of System Management Mode, http://ieeexplore.ieee.org/xpls/abs_all.jsp?arnumber=6704682.

*Primary Examiner* — Jaweed A Abbaszadeh
*Assistant Examiner* — Hyun Soo Kim
(74) *Attorney, Agent, or Firm* — Brooks Cameron & Huebsch PLLC

(57) ABSTRACT

Example systems relate to power monitoring and reduction processes. An example system may include a modular computing device including a plurality of universal serial bus (USB) ports and a power supply unit coupled to the modular computing device. The example system may further include an embedded controller coupled to the power supply unit and to the plurality of USB port. The embedded controller may monitor a level of power consumed by the system and determine whether a surge event has occurred in the system. In response to the determination that the surge event has occurred, the embedded controller may determine whether an agency event has occurred in the system and initiate a power reduction process in response to the determination.

11 Claims, 3 Drawing Sheets

(51) Int. Cl.
*G06F 1/28* (2006.01)
*G01R 19/165* (2006.01)

(56) References Cited

U.S. PATENT DOCUMENTS

| | | | |
|---|---|---|---|
| 7,536,567 | B2 | 5/2009 | Bonola et al. |
| 7,689,851 | B2 | 3/2010 | Sawyers et al. |
| 2011/0130982 | A1 | 6/2011 | Haag et al. |
| 2012/0035774 | A1 | 2/2012 | Yasugi |
| 2012/0063047 | A1* | 3/2012 | Divan .................. H02H 3/025 361/93.9 |
| 2014/0001977 | A1 | 1/2014 | Zacharchuk et al. |
| 2014/0129856 | A1* | 5/2014 | Bertin .................. G06F 1/266 713/320 |
| 2014/0157021 | A1* | 6/2014 | Varma .................. G06F 1/3234 713/321 |
| 2014/0195061 | A1 | 7/2014 | Stanczak et al. |
| 2014/0208140 | A1* | 7/2014 | Brooks .................. G06F 1/28 713/320 |
| 2014/0268459 | A1* | 9/2014 | Robinson ............... H02H 3/093 361/87 |
| 2014/0343744 | A1* | 11/2014 | Mansfield ................ H02J 3/14 700/297 |

FOREIGN PATENT DOCUMENTS

| | | |
|---|---|---|
| CN | 102395937 | 3/2012 |
| CN | 104094179 | 10/2014 |
| CN | 104798002 | 7/2015 |
| CN | 105373205 | 3/2016 |
| EP | 2728439 | 5/2014 |
| EP | 2957984 | 12/2015 |

* cited by examiner

POWER MONITORING AND REDUCTION

BACKGROUND

Managing power for a computing system involves a combination of understanding the power requirements of the system and using a power supply with a large enough voltage to supply each portion of the system. As systems become more powerful, various components use correspondingly more power. In some situations, this higher use of power may cause too much power to flow to the system, such that the system and/or its components may be damaged.

DETAILED DESCRIPTION

Computing systems use multiple components, such as processors, memory units, and input/output (IO) devices, each of which uses an amount of power. Power is often supplied by a power supply unit. As computing systems become more powerful, components are able to deliver larger amounts of power. For example, some types of IO devices and ports, such as a Universal Serial Bus-C (USB-C) port, are able to deliver more power than USB ports have been able to. While a larger power supply unit may be used in order to provide full power to all components, using a larger power supply is not always cost effective. However, a smaller power supply unit may be unable to provide fully power to the system.

In some examples, when a power supply unit is unable to provide full power to a system, the power supply may draw a surge current. As used herein, a surge current refers to a current in excess of a power supply unit's rated current. A surge current lasting only a few seconds may cause minor to no damage to the power supply unit and/or the computing system. However, a surge current lasting a longer period of time may cause irreversible damage to the power supply unit and/or the computing system. For example, a longer lasting surge current may cause the power supply unit to overheat. The longer lasting surge current may further cause the components of the computing system to receive an amount of current above what the component is designed to handle, permanently damaging the component.

Power monitoring processes according to the present disclosure allow a computing system to monitor a level of power supplied by a power supply unit. The system may detect that the power supply unit is supplying a surge current. In response, the system may take a series of actions to reduce the power to a level where a surge current is no longer being supplied, thus preserving both the power supply unit and the components of the computing system.

Figure 1:
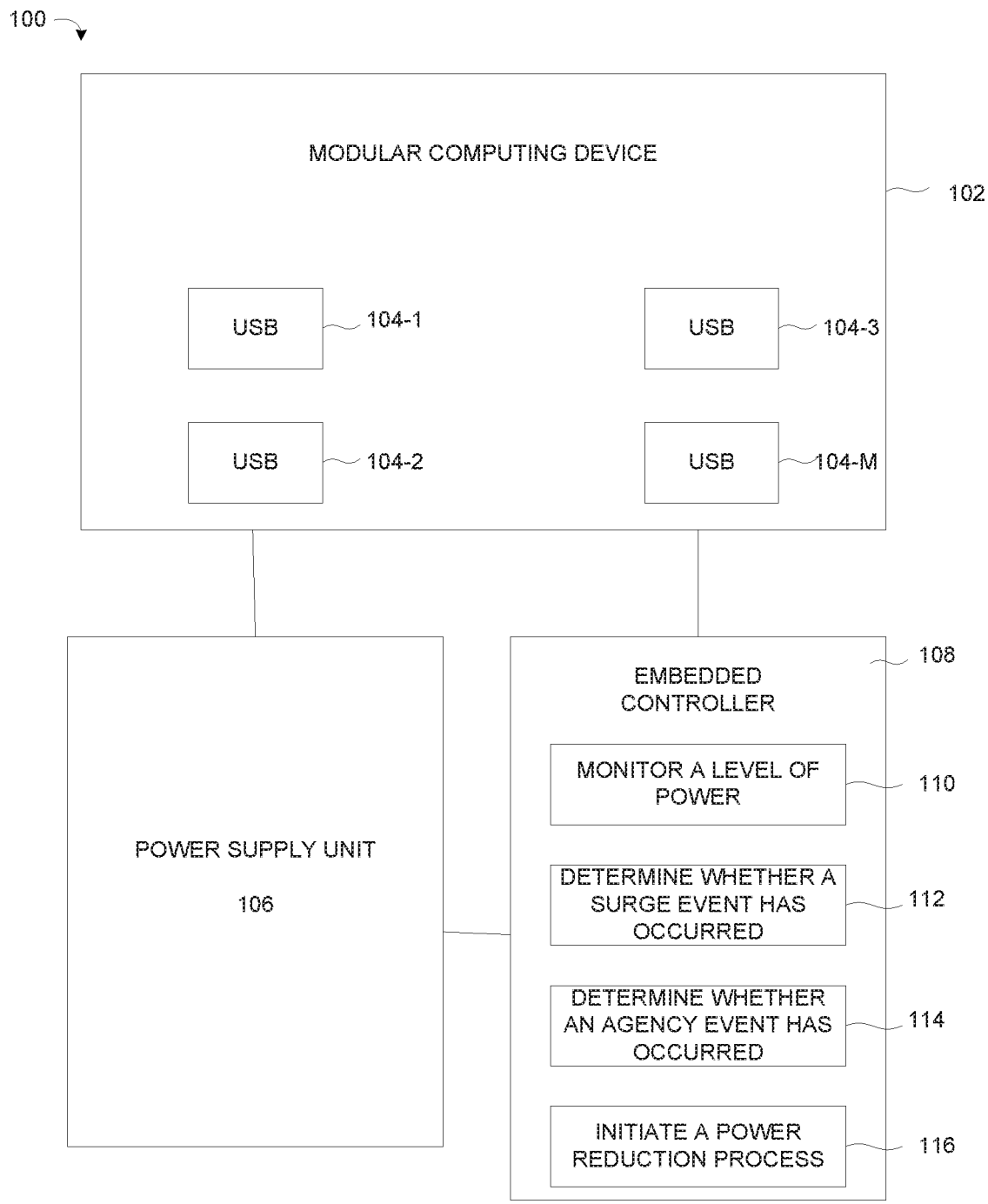
FIG. 1 is a diagram of an example system for power monitoring and reduction, according to the present disclosure.

FIG. 1 is a diagram of an example system 100 for power monitoring and reduction, according to the present disclosure. System 100 may include multiple components, as illustrated in FIG. 1. System 100 may include a modular computing device 102. As used herein, a modular computing device refers a computing device comprising a plurality of user-configurable modules. As such, a modular computing device may be capable of user configuration by adding, removing, and/or altering modules.

Modular computing device 102 may include a plurality of Universal Serial Bus (USB) ports 104-1, 104-2, 104-3 . . . 104-M (hereinafter referred to as USB ports 104). The USB ports 104 may be disposed in various locations within modular computing device 102, such as in a host device or in any of a plurality of expansion modules (not pictured in FIG. 1). In other words, modular computing device 102 may include any number of USB ports, located on any component within modular computing device 102. Additionally, while USB ports 104 are shown disposed horizontally in FIG. 1, examples are not so limited and USB ports 104 may be disposed in any orientation.

System 100 may further include a power supply unit 106. As used herein, a power supply unit refers to a unit to provide power to system 100. Power supply unit 106 may be an Advanced Technology Extended (ATX) unit, an ATX12V unit, or any other variety of power supply unit. Power supply unit 106 may have a power rating. As used herein, a power rating refers to a total safe power output for a power supply unit. As shown in FIG. 1, power supply unit 106 may be coupled to modular computing device 102 and to embedded controller 108.

System 100 may further include an embedded controller 108. As used herein, an "embedded controller" refers to a hardware device in system 100 that controls a specific set of functions within system 100. As shown in FIG. 1, embedded controller 108 may be coupled to modular computing device 102. Embedded controller 108 may be coupled directly, indirectly, or virtually to modular computing device 102. Embedded controller 108 may further be coupled to power supply unit 106.

As shown in FIG. 1, embedded controller 108, when coupled to a processor, may implement instructions such as instructions 110, 112, 114, 116, or any combination thereof. When executed by a processor, monitor a level of power instructions 110 may cause embedded controller 108 monitor a level of power being consumed by system 100. For example, monitor a level of power instructions 110 may cause embedded controller 108 monitor a level of power consumed by modular computing device 102 and by USB ports 104. The power being supplied and monitored may come from power supply unit 106.

Determine whether a surge event has occurred instructions 112, when executed by a processor, may cause embedded controller 108 to determine whether a surge event has occurred within system 100. As used herein, a surge event refers to an event during which the power supplied by power supply unit 106 exceeds a first threshold for a first period of time. The first threshold may correspond to the power rating of power supply unit 106 or may be any other level of power. The first period of time may be a predetermined amount of time.

If embedded controller 108 has determined that a surge event has occurred at 112, embedded controller 108 may first reduce a level of power supplied by power supply unit 106 to system 100 by a first amount. Embedded controller 108 may, for example, reduce a level of power supplied to USB ports 104 by a first amount. The first amount of power by which the power supplied to system 100 is reduced may be less than the first threshold. For example, the first threshold may be 100 watts. Once this first threshold is exceeded, the power supplied to system 100 may be reduced by 25 watts. In such an instance, the 25 watts corresponds to the first amount of power. Examples are not so limited, however, and any first threshold and/or first amount of power may be set. Embedded controller 108 may then recheck the level of power supplied to system 100. The recheck of the level of power may occur at a defined period of time after embedded controller 108 has reduced the level of power to system 100. Put another way, embedded controller 108 may first determine that a surge event has occurred at 112. Embedded controller 108 may then reduce a level of power supplied to system 100 by a first amount, allow a defined period of time to lapse, and then recheck the level of power supplied to system 100.

Determine whether an agency event has occurred instructions 114, when executed by a processor, may cause embedded controller 108 to determine whether an agency event has occurred. As used herein, an agency event refers to an event in which a level of power supplied to system 100 is above a second threshold for a second period of time. The second threshold may be the same as the first threshold or it may be higher. The second threshold may also be less than the first threshold. The second period of time may be the same as the first period of time or it may be greater. The second period of time may also be less than the first period of time.

Initiate a power reduction process instructions 116, when executed by a processor, may cause embedded controller 108 to initiate a power reduction process. As used herein, a power reduction process refers to a decreasing of the level of power supplied to system 100. The power reduction process may be initiated in response to a determination by embedded controller 108 that an agency event has occurred at 114. In such a case, the power reduction process initiated at 116 may include reducing a level of power provided to the system by a second amount of power. The second amount of power may be greater than the first amount of power. Power may be reduced to the USB ports 104 and/or to the modular computing device 102. Embedded controller 108 may then recheck the level of power consumed by the system after a defined period of time. Further, embedded controller 108 may continue to receive instructions from a processor to monitor system 100 and may continue the power reduction process. Such further steps are described herein in relation to FIGS. 2 and 3.

Figure 2:
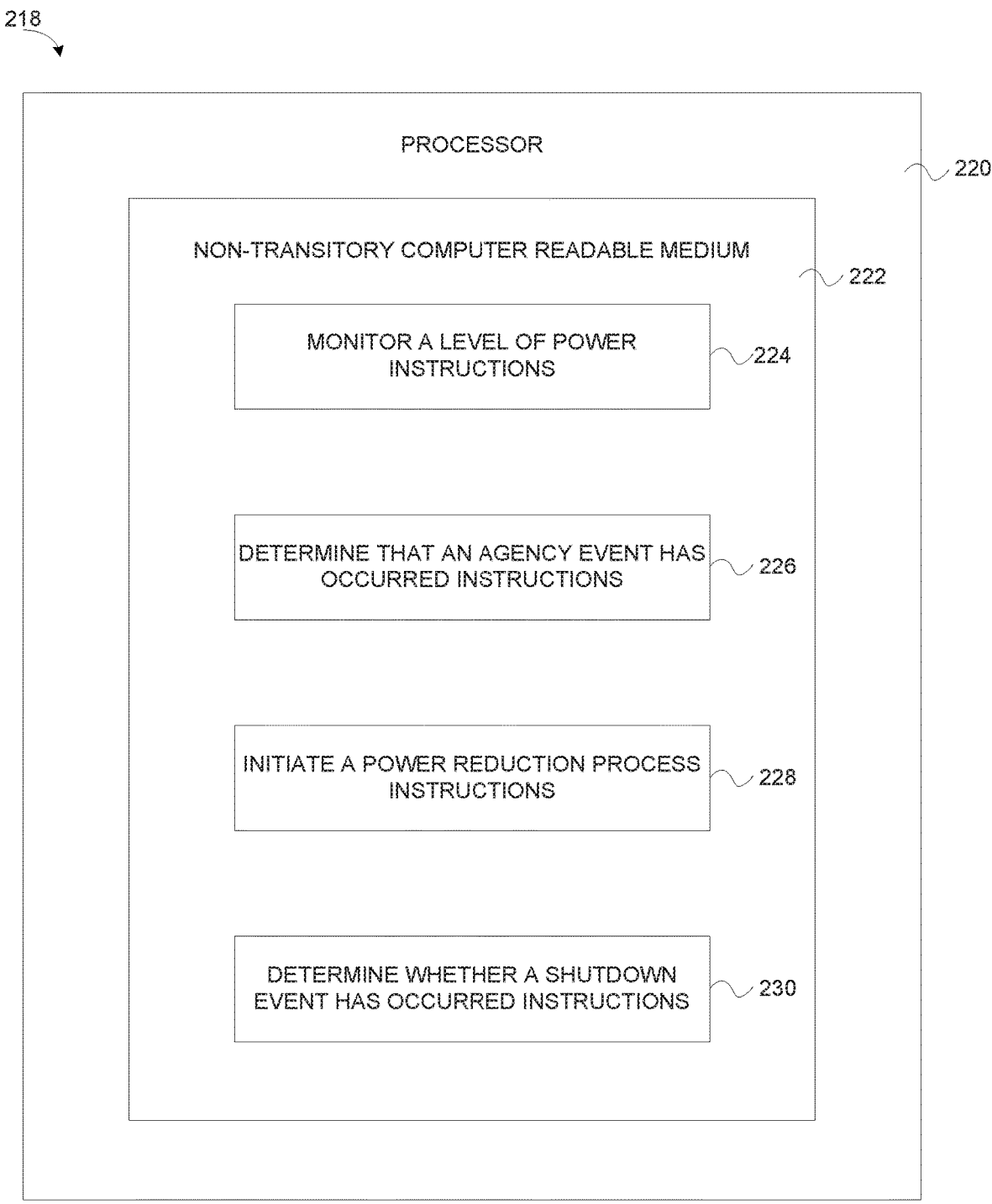
FIG. 2 is a block diagram of an example system for power monitoring and reduction, according to the present disclosure.

FIG. 2 is a block diagram of an example system 218 for power monitoring and reduction according to the present disclosure. As shown in FIG. 2, system 218 may include multiple components. For example, system 218 may include a processor 220 and a non-transitory computer-readable storage medium 222. Although the following descriptions refer to a single processor and a single computer readable storage medium, the descriptions may also apply to a system with multiple processors and multiple computer readable storage mediums. In such examples, the instructions may be distributed (e.g., stored) across multiple computer readable storage mediums and the instructions may be distributed (e.g., executed by) across multiple processors.

Processor 220 may be a central processing unit (CPU), a semiconductor based microprocessor, and/or other hardware devices suitable for retrieval and execution of instructions stored in computer-readable storage medium 222. Processor 220 may fetch, decode, and execute instructions 224, 226, 228, 230, or a combination thereof. As an alternative or in addition to retrieving and executing instructions, processor 220 may include at least one electronic circuit that includes electronic components for performing the functionality of instructions 224, 226, 228, 230, or a combination thereof.

Computer readable storage medium 222 may be any electronic, magnetic, optical, or other physical storage device that stores executable instructions. Thus, computer readable storage medium 222 may be, for example, Random Access Memory (RAM), an Electrically-Erasable Programmable Read-Only Memory (EEPROM), a storage drive, an optical disc, and the like. Computer readable storage medium 222 may be disposed within system 218, as shown in FIG. 2. In this situation, the executable instructions may be "installed" on the system 218. Additionally and/or alternatively, computer readable storage medium 222 may be a portable, external or remote storage medium, for example, that allows system 218 to download the instructions from the portable/external/remote storage medium. In this situation, the executable instructions may be part of an "installation package". As described herein, computer readable storage medium 222 may be encoded with executable instructions for power monitoring.

Referring to FIG. 2, monitor a level of power instructions 224, when executed by a processor such as processor 220, may cause processor 220 to monitor a level of power consumed by system 218. System 218 may include a plurality of components, such as USB ports (not shown in FIG. 2). Monitor a level of power instructions 224 may thus cause processor 220 to monitor the power level being consumed by each component of system 218, or may cause processor 220 to only monitor the power level being consumed by a subset of the components of system 218.

Determine that an agency event has occurred instructions 226, when executed by a processor such as processor 220, may cause processor 220 to determine that an agency event has occurred within system 218. Determine that an agency event instructions 226 may include instructions executable by processor 220 to determine that a level of power consumed by system 218 is above a second threshold for a second period of time. Determine that an agency event has occurred instructions 226 may be akin to determine whether an agency event occurred instructions 114 of FIG. 1.

Initiate a power reduction process instructions 228, when executed by a processor such as processor 220, may cause processor 220 to initiate a power reduction process. That is, initiate a power reduction process instructions 228 may cause processor 220 to reduce the power to system 218. As discussed above, the power reduction may occur in response to the determination that an agency event has occurred at 226. Initiate a power reduction process instructions 228 may include instructions executable by processor 220 to reduce a level of power provided to system 218. Initiate a power reduction process instructions 228 may further include instructions to recheck the level of power consumed by system 218 after a defined period of time. The defined period of time may be any period of time to elapse after the reduction of power to system 218.

Determine whether a shutdown event has occurred instructions 230, when executed by a processor such as processor 220, may cause processor 220 to determine whether a shutdown event has occurred within system 218. As used herein, a shutdown event refers to an event during which a level of power supplied to system 218 is above a third threshold for a third period of time. The third threshold may be greater than, less than, or equal to the first and/or second thresholds. The third period of time may be greater than, less than, or equal to the first and/or second periods of time.

If processor 220 determines that a shutdown event has occurred at 230, processor 220 may further execute instructions to terminate power to system 218. System 218 may remain without power for a fourth period of time. The fourth period of time may be greater than the third period of time. Processor 220 may then execute instructions to restore power to system 218. As used herein, to restore power means to return power to system 218 at a level of power below the second threshold. Said differently, processor 220 may execute instructions to terminate power to system 218, allow a fourth period of time to elapse, and restore power to system 218.

Figure 3:
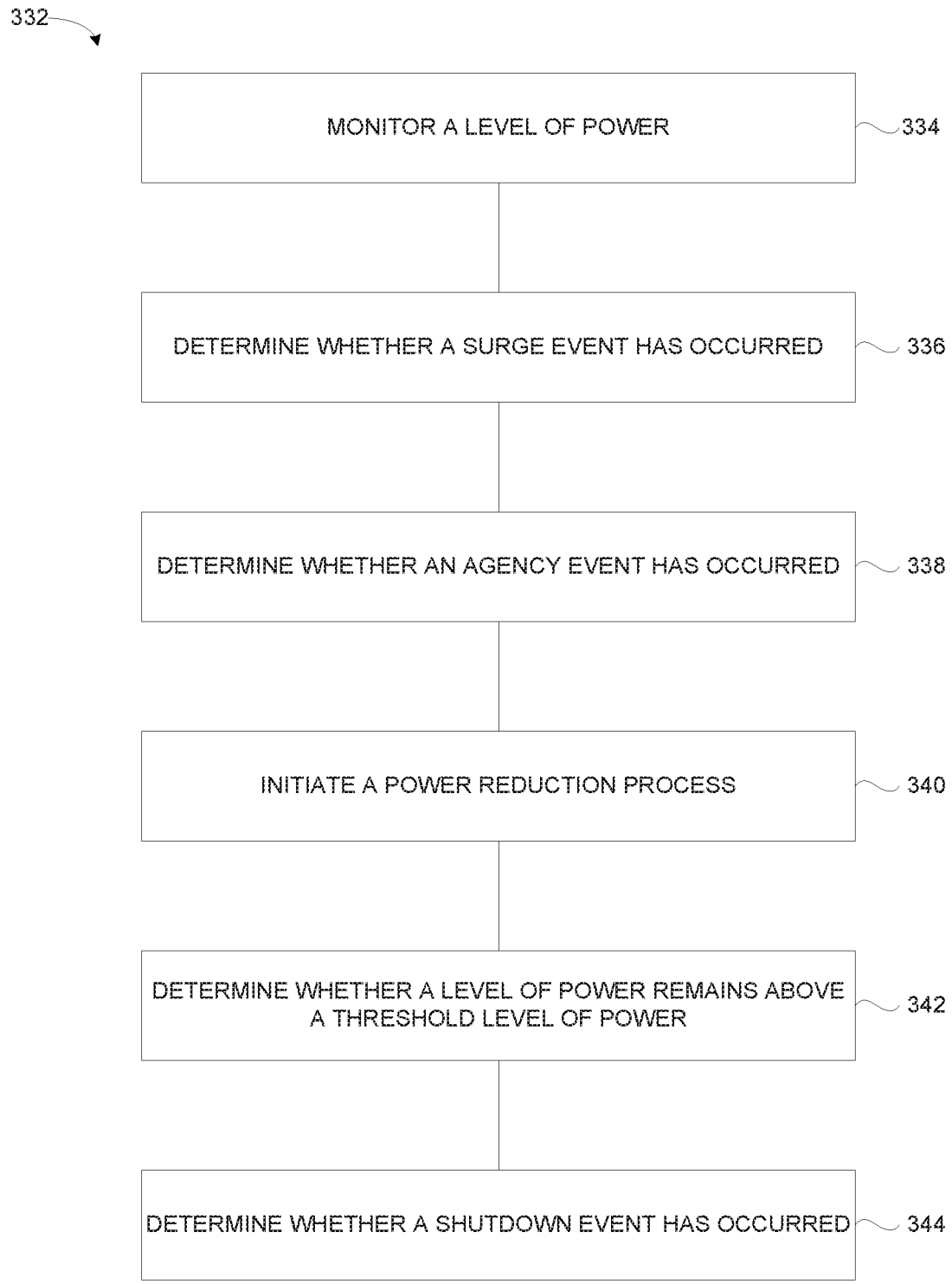
FIG. 3 illustrates an example method for power monitoring and reduction, according to the present disclosure.

FIG. 3 illustrates an example method 332 for power monitoring and reduction according to the present disclosure. At 334, a level of power supplied to a system may be monitored. The system may include a plurality of USB ports, and the level of power monitored at 334 may include the level of power supplied to the plurality of USB ports.

At 336, method 332 includes determining whether a surge event has occurred. As discussed previously, determining whether a surge event has occurred may include determining that a level of power supplied to the system exceeds a first threshold for a first period of time. In response to a determination that a surge event has occurred at 336, method 332 may include reducing a level of power to the system by a first amount. Method 332 may further include continuing to monitor a level of power supplied to the system in response to identifying that the surge event has occurred at 336.

At 338, method 332 includes determining whether an agency event has occurred. As previously discussed, determining whether an agency event has occurred comprises determining that the level of power supplied to the system is above a second threshold for a second period of time. The second threshold may be the same as, greater than, or less than the first threshold, and the second period of time may the same as, greater than, or less than the first period of time. Determining whether an agency event has occurred at 338 may occur in response to a determination that a surge event has occurred at 336.

At 340, method 332 may include initiating a power reduction process. Initiating a power reduction process at 340 may include reducing the level of power supplied to the system by a second amount. The second amount may be greater than the first amount. Initiating a power reduction process at 340 may further include rechecking the level of power supplied to the system after a defined period of time. The defined period of time may be any period of time to elapse after the initiation of the power reduction process at 340.

At 342, method 332 may include determining whether a level of power remains above a threshold level. The threshold level may correspond to the second threshold level or may be a separate threshold level. Determining whether a level of power remains above a threshold level at 342 may occur in response to determining that an agency event occurred at 338 and initiating a power reduction process at 340.

At 344, method 332 may include determining whether a shutdown event has occurred. As discussed previously, determining whether a shutdown event has occurred includes determining that the level of power supplied to the system is above a third threshold level for a third period of time. Determining whether a shutdown event has occurred at 344 may further include terminating power to the system in response to the determination that the level of power supplied to the system is above the third threshold level for the third period of time.

In the foregoing detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. As used herein, the designator "M", particularly with respect to reference numerals in the drawings, indicates that a number of the particular feature so designated can be included with examples of the present disclosure. The designators can represent the same or different numbers of the particular features.

What is claimed:

1. A system comprising:
   a modular computing device including a plurality of universal serial bus (USB) ports;
   a power supply unit coupled to the modular computing device;
   an embedded controller coupled to the power supply unit and to the plurality of USB ports, the embedded controller to:
   monitor a level of power consumed by the system;
   determine whether a surge event has occurred in the system based on the level of power being consumed by the system being above a first threshold for a first defined period of time;
   in response to the determination that the surge event has occurred:
      initiate a power reduction process to reduce the level of power for the plurality of USB ports from a first level of power by a first amount to a second level of power, wherein the second level of power is greater than zero; and
      determine whether an agency event has occurred in the system in response to the determination that the surge event has occurred based on the level of power consumed by the system being above a second threshold for a second defined period of time;
   in response to the determination that the agency event has occurred, initiate the power reduction process to reduce the level of power for the plurality of USB ports by a second amount from the second level of power to a third level of power;
   in response to a determination that the level of power consumed by the system remains above a threshold after the agency event, determine whether a shutdown event has occurred, wherein the shutdown event comprises:
      a determination that an upper threshold of power has been exceeded; and
      termination of power to the plurality of USB ports;
   in response to a defined period of time elapsing following the shutdown event, restore power to the plurality of USB ports.

2. The system of claim 1, wherein in response to determination that the surge event has occurred, the embedded controller is to recheck the level of power consumed by the system after another defined period of time.

3. The system of claim 2, wherein in response to the determination that the agency event has occurred, the embedded controller is to:
  reduce the level of power provided to the system by the second amount, wherein the second amount is greater than the first amount; and
  recheck the level of power consumed by the system after another defined period of time.

4. A non-transitory computer-readable storage medium containing instructions that when executed cause a processor to:
  monitor a level of power consumed by a system, wherein the system includes a plurality of universal serial bus (USB) ports;
  determine whether a surge event has occurred in the system based on the level of power being consumed by the system being above a first threshold fora first defined period of time;
  determine whether an agency event has occurred in the system in response to the determination that the surge event has occurred based on the level of power consumed by the system being above a second threshold for a second defined period of time;
  in response to the determination that the agency event has occurred, initiate a power reduction process to reduce a level of power for the plurality of USB ports from a first level of power by a first amount to a second level of power, wherein the second level of power is greater than zero;
  in response to a determination that the level of power consumed by the system remains above a threshold after the agency event, determine whether a shutdown event has occurred in the system in response to:
    a determination that an upper threshold of power has been exceeded for another a first defined period of time; and
    termination of power to the plurality of USB ports; and
  in response to another defined period of time elapsing following the shutdown event, restore power to the plurality of USB ports.

5. The non-transitory computer-readable storage medium of claim 4, wherein to initiate a power reduction process in response to the determination that the agency event has occurred includes instructions to:
  reduce the level of power provided to the system by a second amount; and
  recheck the level of power consumed by the system after a further defined period of time.

6. The non-transitory computer-readable storage medium of claim 4, wherein determining whether the shutdown event has occurred includes instructions to determine that the level of power consumed by the system is above a third threshold for a third defined period of time.

7. The non-transitory computer-readable storage medium of claim 4, further comprising instructions to terminate power to the system in response to the determination that the shutdown event has occurred.

8. A method, comprising:
  monitoring, by an embedded controller, a level of power supplied to a system, wherein the system includes a plurality of universal serial bus (USB) ports;
  determining, by the embedded controller, whether a surge event has occurred within the system based on the level of power being consumed by the system being above a first threshold fora first defined period of time;
  initiating, by the embedded controller, a power reduction process to reduce the level of power for the plurality of USB ports from a first level of power by a first amount to a second level of power in response to the determination by the embedded controller that the surge event has occurred, wherein the second level of power is greater than zero;
  determining, by the embedded controller, whether an agency event has occurred in the system in response to the determination by the embedded controller that the surge event has occurred and based on the level of power consumed by the system being above a second threshold for a second defined period of time;
  initiating, by the embedded controller, a power reduction process to reduce the level of power for the plurality of USB ports by a second amount from the second level of power to a third level of power in response to the determination by the embedded controller that the agency event has occurred;
  determining, by the embedded controller, whether the third level of power supplied to the system remains above an upper threshold after the agency event;
  determining, by the embedded controller, whether a shutdown event has occurred in response to:
    the determination by the embedded controller that the third level of power supplied to the system is above the upper threshold; and
    termination of power to the plurality of USB ports; and
  restoring, by the embedded controller in response to another defined period of time elapsing following the shutdown event, power to the plurality of USB ports.

9. The method of claim 8, wherein determining by the embedded controller whether the surge event has occurred comprises:
  reducing the level of power to the system by the first amount; and
  continuing to monitor the level of power supplied to the system in response to identifying that the surge event has occurred.

10. The method of claim 9, wherein the power reduction process initiated by the embedded controller comprises:
  reducing the second level of power to the system by the second amount to the third level of power, wherein the second amount is greater than the first amount; and
  rechecking the level of power supplied to the system after a further defined period of time.

11. The method of claim 8, wherein determining by the embedded controller whether the shutdown event has occurred comprises determining that the third level of power supplied to the system is above a third threshold for a third defined period of time.

* * * * *